(12) United States Patent
Ho et al.

(10) Patent No.: US 12,212,332 B2
(45) Date of Patent: Jan. 28, 2025

(54) DIGITAL-TO-ANALOG CONVERSION APPARATUS AND METHOD HAVING SIGNAL CALIBRATION MECHANISM

(71) Applicant: REALTEK SEMICONDUCTOR CORPORATION, Hsinchu (TW)

(72) Inventors: Hsuan-Ting Ho, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 178 days.

(21) Appl. No.: 18/105,675

(22) Filed: Feb. 3, 2023

(65) Prior Publication Data

US 2023/0308108 A1 Sep. 28, 2023

(30) Foreign Application Priority Data

Mar. 23, 2022 (TW) .................. 111110943

(51) Int. Cl.
*H03M 1/10* (2006.01)
*H03M 1/06* (2006.01)

(52) U.S. Cl.
CPC ....... *H03M 1/1014* (2013.01); *H03M 1/0604* (2013.01); *H03M 1/1042* (2013.01)

(58) Field of Classification Search
CPC . H03M 1/1014; H03M 1/0604; H03M 1/1042
USPC ....................................................... 341/120
See application file for complete search history.

(56) References Cited

U.S. PATENT DOCUMENTS 8,847,801 B2 * 9/2014 Song ............... H03M 1/1061
341/120
9,673,959 B2 * 6/2017 Zhou .................... H04M 9/082

OTHER PUBLICATIONS

U.S. Appl. No. 17/111,824 (USPTO receipt date: Dec. 4, 2020) 1-1) U.S. Appl. No. 17/111,824_spec 1-2) U.S. Appl. No. 17/111,824_drawing.
U.S. Appl. No. 17/691,502 (USPTO receipt date: Mar. 10, 2022) 2-1) U.S. Appl. No. 17/691,502_spec 2-2) U.S. Appl. No. 17/691,502_drawing 2-3) U.S. Appl. No. 17/691,502_efilingAck45196393.

(Continued)

*Primary Examiner* — Khai M Nguyen
(74) *Attorney, Agent, or Firm* — WPAT, PC

(57) ABSTRACT

The present invention discloses a digital-to-analog conversion apparatus having signal calibration mechanism is provided. A digital-to-analog conversion circuit includes conversion circuits to generate an output analog signal and echo-canceling analog signals. An echo transmission circuit processes an echo-transmitting path to generate an echo signal. An echo calibration circuit generates an output calibration signal and echo-canceling calibration signals according to an input digital circuit through calibration circuits corresponding to the conversion circuits. A calibration parameter calculating circuit generates a plurality of offsets according to an error signal of the echo signal relative to the calibration signals and path information related to the echo calibration circuit. The echo calibration circuit makes response coefficients converge according to the error signal and pseudo-noise transmission path information from the digital-to-analog conversion circuit to the echo transmission circuit, and updates codeword offset table according to the offset.

18 Claims, 6 Drawing Sheets

(56) References Cited

OTHER PUBLICATIONS

U.S. Appl. No. 17/861,393 (USPTO receipt date: Jul. 11, 2022) 3-1) U.S. Appl. No. 17/861,393_spec 3-2) U.S. Appl. No. 17/861,393_drawing 3-3) U.S. Appl. No. 17/861,393_efilingAck46154872.
U.S. Appl. No. 17/728,178 (USPTO receipt date: Apr. 25, 2022) 4-1) U.S. Appl. No. 17/728,178_spec 4-2) U.S. Appl. No. 17/728,178_drawing 4-3) U.S. Appl. No. 17/728,178_efilingAck45552080.

\* cited by examiner

|  |  |  | ΔP | ΔQ | ΔR | ΔS |
|---|---|---|---|---|---|---|
| G16 | P16 | +ΔA+ΔB⋯+ΔO+ΔP+ΔQ+ΔR+ΔS | ○ | ● | □ | ■ |
|  | P15 | +ΔA+ΔB⋯+ΔO+ΔP+ΔQ+ΔR-ΔS | ○ | ● | □ |  |
|  | P14 | +ΔA+ΔB⋯+ΔO+ΔP+ΔQ-ΔR+ΔS | ○ | ● |  | ■ |
|  | P13 | +ΔA+ΔB⋯+ΔO+ΔP+ΔQ-ΔR-ΔS | ○ | ● |  |  |
|  | P12 | +ΔA+ΔB⋯+ΔO+ΔP-ΔQ+ΔR+ΔS | ○ |  | □ | ■ |
|  | P11 | +ΔA+ΔB⋯+ΔO+ΔP-ΔQ+ΔR-ΔS | ○ |  | □ |  |
|  | P10 | +ΔA+ΔB⋯+ΔO+ΔP-ΔQ-ΔR+ΔS | ○ |  |  | ■ |
|  | P09 | +ΔA+ΔB⋯+ΔO+ΔP-ΔQ-ΔR-ΔS | ○ |  |  |  |
|  | P08 | +ΔA+ΔB⋯+ΔO-ΔP+ΔQ+ΔR+ΔS |  | ● | □ | ■ |
|  | P07 | +ΔA+ΔB⋯+ΔO-ΔP+ΔQ+ΔR-ΔS |  | ● | □ |  |
|  | P06 | +ΔA+ΔB⋯+ΔO-ΔP+ΔQ-ΔR+ΔS |  | ● |  | ■ |
|  | P05 | +ΔA+ΔB⋯+ΔO-ΔP+ΔQ-ΔR-ΔS |  | ● |  |  |
|  | P04 | +ΔA+ΔB⋯+ΔO-ΔP-ΔQ+ΔR+ΔS |  |  | □ | ■ |
|  | P03 | +ΔA+ΔB⋯+ΔO-ΔP-ΔQ+ΔR-ΔS |  |  | □ |  |
|  | P02 | +ΔA+ΔB⋯+ΔO-ΔP-ΔQ-ΔR+ΔS |  |  |  | ■ |
|  | P01 | +ΔA+ΔB⋯+ΔO-ΔP-ΔQ-ΔR-ΔS |  |  |  |  |
| G01 | N16 | -ΔA-ΔB-…-ΔO+ΔP+ΔQ+ΔR+ΔS | ○ | ● | □ | ■ |
|  | N15 | -ΔA-ΔB-…-ΔO+ΔP+ΔQ+ΔR-ΔS | ○ | ● | □ |  |
|  | N14 | -ΔA-ΔB-…-ΔO+ΔP+ΔQ-ΔR+ΔS | ○ | ● |  | ■ |
|  | N13 | -ΔA-ΔB-…-ΔO+ΔP+ΔQ-ΔR-ΔS | ○ | ● |  |  |
|  | N12 | -ΔA-ΔB-…-ΔO+ΔP-ΔQ+ΔR+ΔS | ○ |  | □ | ■ |
|  | N11 | -ΔA-ΔB-…-ΔO+ΔP-ΔQ+ΔR-ΔS | ○ |  | □ |  |
|  | N10 | -ΔA-ΔB-…-ΔO+ΔP-ΔQ-ΔR+ΔS | ○ |  |  | ■ |
|  | N09 | -ΔA-ΔB-…-ΔO+ΔP-ΔQ-ΔR-ΔS | ○ |  |  |  |
|  | N08 | -ΔA-ΔB-…-ΔO-ΔP+ΔQ+ΔR+ΔS |  | ● | □ | ■ |
|  | N07 | -ΔA-ΔB-…-ΔO-ΔP+ΔQ+ΔR-ΔS |  | ● | □ |  |
|  | N06 | -ΔA-ΔB-…-ΔO-ΔP+ΔQ-ΔR+ΔS |  | ● |  | ■ |
|  | N05 | -ΔA-ΔB-…-ΔO-ΔP+ΔQ-ΔR-ΔS |  | ● |  |  |
|  | N04 | -ΔA-ΔB-…-ΔO-ΔP-ΔQ+ΔR+ΔS |  |  | □ | ■ |
|  | N03 | -ΔA-ΔB-…-ΔO-ΔP-ΔQ+ΔR-ΔS |  |  | □ |  |
|  | N02 | -ΔA-ΔB-…-ΔO-ΔP-ΔQ-ΔR+ΔS |  |  |  | ■ |
|  | N01 | -ΔA-ΔB-…-ΔO-ΔP-ΔQ-ΔR-ΔS |  |  |  |  |

Fig. 6

DIGITAL-TO-ANALOG CONVERSION APPARATUS AND METHOD HAVING SIGNAL CALIBRATION MECHANISM

BACKGROUND OF THE INVENTION

1. Field of the Invention

The present invention relates to a digital-to-analog conversion apparatus and a digital-to-analog conversion method having signal calibration mechanism.

2. Description of Related Art

A digital-to-analog conversion apparatus is an important circuit component to convert a signal from a digital form to an analog form. The digital-to-analog conversion apparatus multiply different digital codes by corresponding conversion gain values to generate analog signals having different intensities.

However, the conversion result of the digital-to-analog conversion apparatus may include offsets due to the offset values of current sources included therein. Further, the mismatch between the signal and the transmission path may cause echo. Different calibration technologies are required by the digital-to-analog conversion apparatus to calibrate the signal generated thereby to accomplish a better conversion result.

SUMMARY OF THE INVENTION

In consideration of the problem of the prior art, an object of the present invention is to supply a digital-to-analog conversion apparatus and a digital-to-analog conversion method having signal calibration mechanism.

The present invention discloses a digital-to-analog conversion apparatus having signal calibration mechanism that includes a digital-to-analog conversion circuit, an echo transmission circuit, an echo calibration circuit and a calibration parameter calculating circuit. The digital-to-analog conversion circuit includes a plurality of conversion circuits to perform conversion according to a signal feeding related to an input digital signal having an input codeword to generate an output analog signal and a plurality of echo-canceling analog signals, wherein the echo-canceling analog signals perform output echo-canceling and mismatch echo-canceling on the output analog signal on an echo-transmitting path. The echo transmission circuit performs signal processing on the echo-transmitting path to generate an echo signal. The echo calibration circuit includes a plurality of calibration circuits corresponding to the conversion circuits to perform mapping by using a plurality of codeword offset tables and perform processing by using a plurality of groups of response coefficients according to the signal feeding related to the input digital signal, to generate an output calibration signal and a plurality of echo-canceling calibration signals. The calibration parameter calculating circuit generates a plurality of offset values according to an error signal, which is a difference between the echo signal and a sum of the output calibration signal and the echo-canceling calibration signals, and path information related to the echo calibration circuit. The echo calibration circuit makes the groups of response coefficients converge according to the error signal and pseudo-noise transmission path information from the digital-to-analog conversion circuit to the echo transmission circuit and updates the codeword offset tables according to the offset values.

The present invention also discloses a digital-to-analog conversion method having signal calibration mechanism used in a digital-to-analog conversion apparatus that includes steps outlined below. Conversion is performed according to a signal feeding related to an input digital signal having an input codeword by a digital-to-analog conversion circuit comprising a plurality of conversion circuits, to generate an output analog signal and a plurality of echo-canceling analog signals, wherein the echo-canceling analog signals perform output echo-canceling and mismatch echo-canceling on the output analog signal on an echo-transmitting path. Signal processing is performed on the echo-transmitting path by an echo transmission circuit to generate an echo signal. Mapping is performed by using a plurality of codeword offset tables and performing processing by using a plurality of groups of response coefficients according to the signal feeding related to the input digital signal by an echo calibration circuit comprising a plurality of calibration circuits corresponding to the conversion circuits, to generate an output calibration signal and a plurality of echo-canceling calibration signals. A plurality of offset values are generated by a calibration parameter calculating circuit according to an error signal, which is a difference between the echo signal and a sum of the output calibration signal and the echo-canceling calibration signals, and path information related to the echo calibration circuit. The groups of response coefficients are made to converge according to the error signal and pseudo-noise transmission path information from the digital-to-analog conversion circuit to the echo transmission circuit and updating the codeword offset tables according to the offset values by the echo calibration circuit.

These and other objectives of the present invention will no doubt become obvious to those of ordinary skill in the art behind reading the following detailed description of the preferred embodiments that are illustrated in the various figures and drawings.

BRIEF DESCRIPTION OF THE DRAWINGS

FIG. 6 illustrates a detailed diagram of the value groups according to an embodiment of the present invention.

DETAILED DESCRIPTION OF THE PREFERRED EMBODIMENTS

An aspect of the present invention is to provide a digital-to-analog conversion apparatus and a digital-to-analog conversion method having signal calibration mechanism to dispose conversion circuits for echo-canceling and corresponding echo calibration circuits based on different sources and types of echoes, such that the conversion circuits generate echo-canceling signals to cancel the echoes and the echo calibration circuits decrease the static mismatch offsets of the conversion circuits to obtain a better echo-canceling result.

Figure 1:
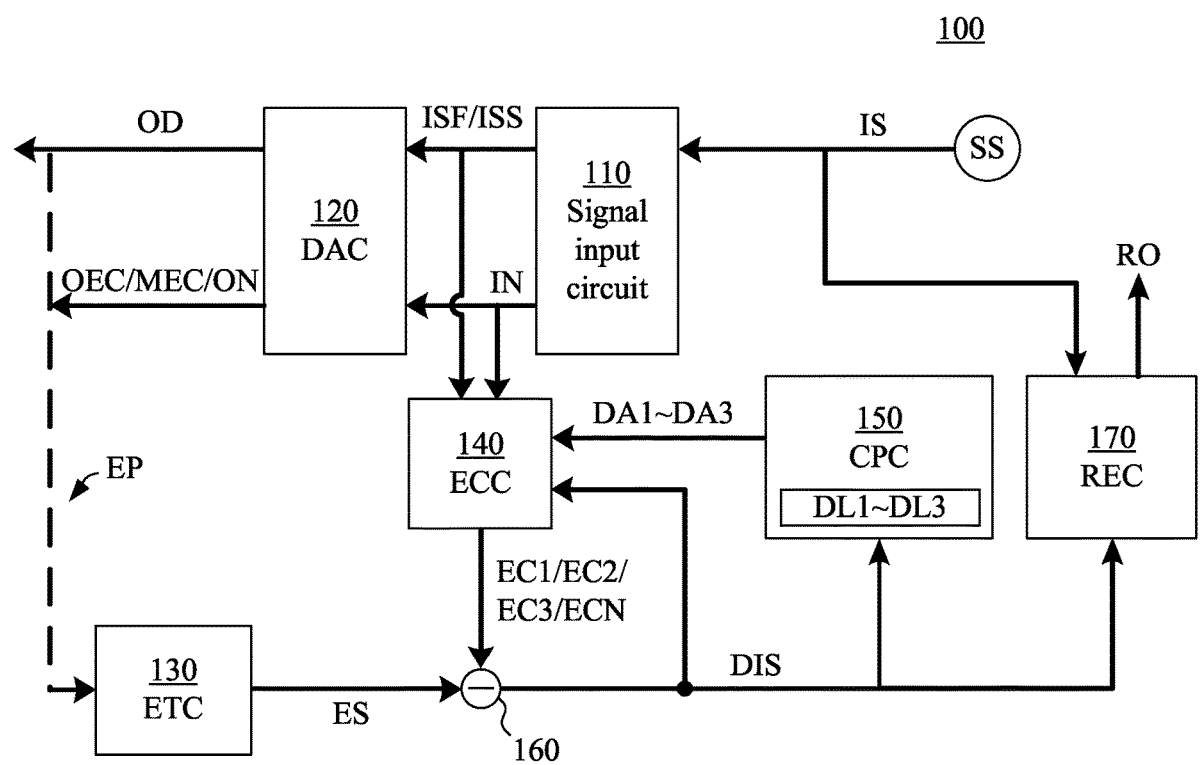
FIG. 1 illustrates a block diagram of a digital-to-analog conversion apparatus having signal calibration mechanism according to an embodiment of the present invention.

Reference is now made to FIG. 1. FIG. 1 illustrates a block diagram of a digital-to-analog conversion apparatus 100 having signal calibration mechanism according to an embodiment of the present invention. In an embodiment, the digital-to-analog conversion apparatus 100 is operated under a first frequency and the signals outputted and received by the digital-to-analog conversion apparatus 100 are operated under a second frequency. The first frequency is 2n times of the second frequency, in which n is a positive integer. In a numerical example, n is 1, in which the first frequency is 800 MHz and the second frequency is 400 MHz. However, the present invention is not limited thereto. Using such a configuration makes sure that the sampling phases have no deadzone when the digital-to-analog conversion apparatus 100 performs sampling on a signal to accomplish a better signal calibration result.

The digital-to-analog conversion apparatus 100 includes a signal input circuit 110, a digital-to-analog conversion circuit 120 (abbreviated as DAC in FIG. 1), an echo transmission circuit 130 (abbreviated as ETC in FIG. 1), an echo calibration circuit 140 (abbreviated as ECC in FIG. 1) and a calibration parameter calculating circuit 150 (abbreviated as CPC in FIG. 1).

The signal input circuit 110 performs signal feeding on the digital-to-analog conversion circuit 120. The digital-to-analog conversion circuit 120 includes a plurality of conversion circuits to perform conversion according to the signal feeding related to an input digital signal IS having an input codeword to generate an output analog signal OD and a plurality of echo-canceling analog signals Reference is now made to FIG. 2 and FIG. 3 at the same time to describe the operation of the signal input circuit 110 and the digital-to-analog conversion circuit 120.

Figure 2:
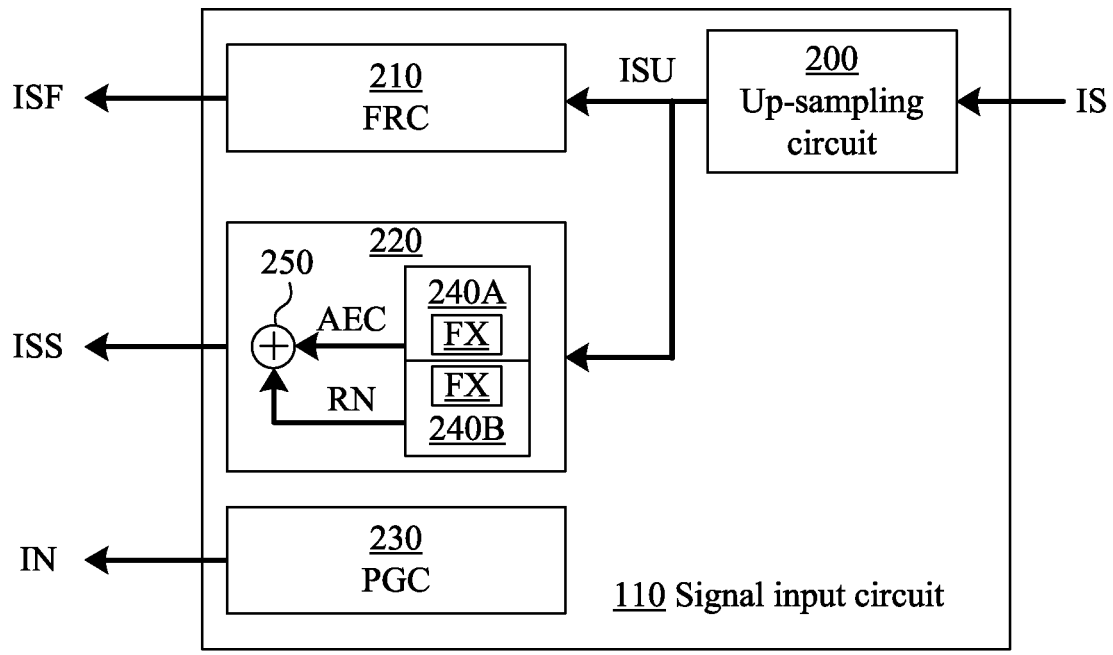
FIG. 2 illustrates a detailed block diagram of the signal input circuit according to an embodiment of the present invention.

FIG. 2 illustrates a detailed block diagram of the signal input circuit 110 according to an embodiment of the present invention. The signal input circuit 110 includes an up-sampling circuit 200, a filtering and rounding circuit 210 (abbreviated as FRC in FIG. 2), a response and rounding circuit 220 (no text labeled in FIG. 2) and a pseudo-noise generation circuit 230 (abbreviated as PGC in FIG. 2).

Figure 3:
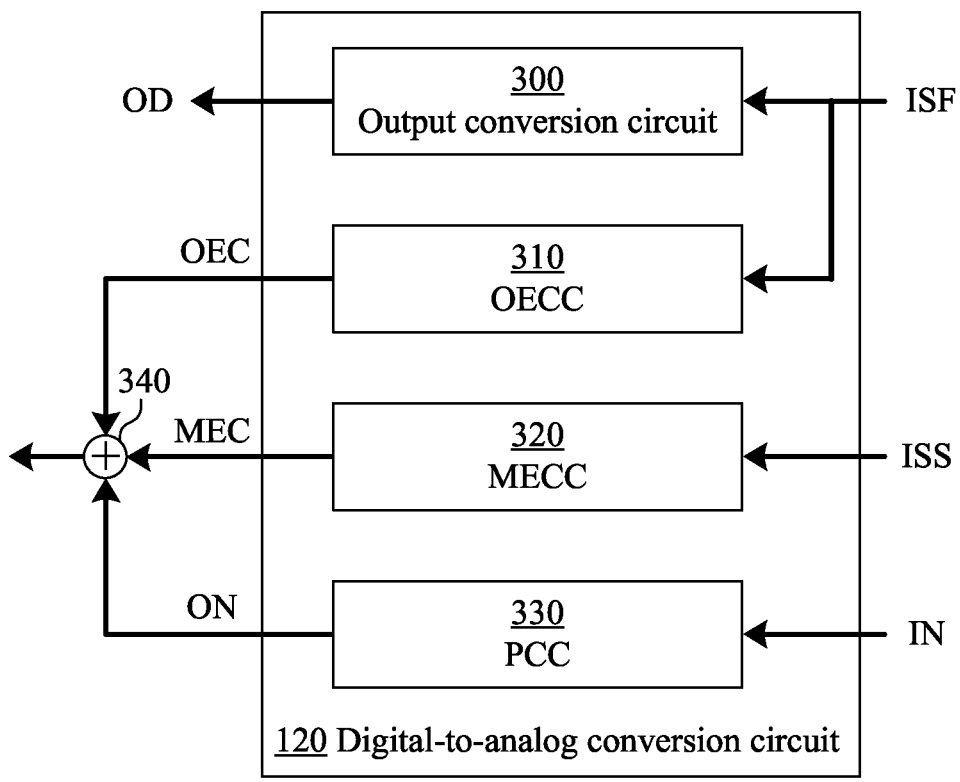
FIG. 3 illustrates a detailed block diagram of the digital-to-analog conversion circuit according to an embodiment of the present invention.

FIG. 3 illustrates a detailed block diagram of the digital-to-analog conversion circuit 120 according to an embodiment of the present invention. The conversion circuits in the digital-to-analog conversion circuit 120 include an output conversion circuit 300, an output echo-canceling conversion circuit 310 (abbreviated as OECC in FIG. 3), a mismatch echo-canceling conversion circuit 320 (abbreviated as MECC in FIG. 3) and a pseudo-noise conversion circuit 330 (abbreviated as PCC in FIG. 3).

The up-sampling circuit 200 performs up-sampling on the input digital signal IS to generate an up-sampled signal ISU. In an embodiment, the up-sampling circuit 200 receives the input digital signal IS from such as, but not limited to a signal source SS in a transmitter (TX) of a communication system in FIG. 1.

For example, the input digital signal IS can be an 8-bit signal and be represented in the form of [a b c d]. After the up-sampling circuit 200 performs up-sampling, the up-sampled signal ISU having two times number of bits is generated and is represented in the form of [a 0 b 0 c 0 d 0].

The filtering and rounding circuit 210 performs filtering and rounding on the up-sampled signal ISU to generate and feed a first processed digital signal ISF to the digital-to-analog conversion circuit 120.

In an embodiment, for the example described above, the filtering and rounding circuit 210 performs filtering on the up-sampled signal ISU by using a filter having a form of [½ 1½] first to accomplish the object of spectrum shaping to suppress the high frequency component so as to prevent the up-sampled signal ISU from interfering other circuits with too much noise. The filtered signal is represented in a form of [(a+b)/2 (b+c)/2 (c+d)/2 (d+e)/2] and is further rounded back to the 8-bit format by the filtering and rounding circuit 210.

The output conversion circuit 300 receives and performs conversion on the first processed digital signal ISF to generate the output analog signal OD. The output echo-canceling conversion circuit 310 receives and performs conversion on the first processed digital signal ISF to generate an output echo-canceling analog signal OEC of the echo-canceling analog signals. The output analog signal OD is the signal actually transmitted to the external circuit. However, a part of the output analog signal OD may be leaked to such as, but not limited to a receiver (RX, not illustrated in the figure) through an echo-transmitting path EP in FIG. 1. As a result, the output echo-canceling analog signal OEC is used to perform echo-canceling on the output analog signal OD leaked to the echo-transmitting path EP.

The response and rounding circuit 220 performs processing and rounding on the up-sampled signal ISU according to a conversion path response parameter FX to generate and feed a second processed digital signal ISS to the digital-to-analog conversion circuit 120.

In an embodiment, the response and rounding circuit 220 includes a conversion path response circuit 240, a rounding circuit 240B and a superimposition circuit 250. The conversion path response circuit 240A processes the up-sampled signal ISU according to the conversion path response parameter FX to generate a converted signal AEC. The rounding circuit 240B further performs noise rounding according to the conversion path response parameter FX to generate a rounding processed signal RN. The superimposition circuit 250 further superimposes the converted signal AEC and the rounding processed signal RN to generate the second processed digital signal ISS. In an embodiment, the processed second processed digital signal ISS is signal rounded to have such as, but not limited to 5 bits.

The mismatch echo-canceling conversion circuit 320 receives and performs conversion on the second processed digital signal ISS to generate a mismatched echo-canceling analog signal MEC of the echo-canceling analog signals. When the output analog signal OD is transmitted through a transformer, a reflection from the transformer or a mismatch against external impedance may result in echoes to the echo-transmitting path EP that can not be fully canceled by the output echo-canceling analog signal OEC. As a result, the mismatched echo-canceling analog signal MEC is able to cancel the echoes generated due to the mismatch.

Further, the pseudo-noise generation circuit 230 generates and feeds a pseudo-noise digital signal IN to the digital-to-analog conversion circuit 120. In an embodiment, the pseudo-noise digital signal IN is a random signal of 0 and 1 for noise simulation.

The pseudo-noise conversion circuit 330 receives and performs conversion on the pseudo-noise digital signal IN to generate a pseudo-noise analog signal ON. Since the mismatch echo-canceling conversion circuit 320 described above uses the conversion path response parameter FX to simulate the response of the signal transmitted through and fed back from the echo-transmitting path EP, the generation and feedback of the pseudo-noise digital signal IN and the pseudo-noise analog signal ON are used to measure the response of such a path.

In an embodiment, the digital-to-analog conversion circuit 120 further includes a superimposition circuit 340 to superimpose the analog signals described above and transmit the superimposed result to the echo-transmitting path EP in FIG. 1 to perform echo-canceling on the output analog signal OD leaked to the echo-transmitting path EP.

The echo transmission circuit 130 in FIG. 1 performs signal processing on the echo-transmitting path EP operated under the second frequency to generate an echo signal ES operated under the first frequency. The signal processing described above may include such as, but not limited to echo response processing and analog-to-digital conversion performed based on two times sampling to generate the echo signal ES.

Each of the conversion circuits in the digital-to-analog conversion circuit 120 includes a plurality of current sources (not illustrated in the figure) to generate analog signals according to a corresponding signal feeding. The current sources may include thermometer-controlled current sources and binary-controlled current sources each having a current offset value that results in static mismatch offset on the outputted analog signal.

The echo calibration circuit 140 cancels the static mismatch offset of each of the conversion circuits. The echo calibration circuit 140 includes a plurality of calibration circuits corresponding to the conversion circuits to perform mapping by using a plurality of codeword offset tables and perform processing by using a plurality of groups of response coefficients according to the signal feeding related to the input digital signal IS, to generate an output calibration signal and a plurality of echo-canceling calibration signals. The echo calibration circuit 140 further performs processing on the pseudo-noise digital signal IN according to a group of pseudo-noise response coefficients CCN to generate a pseudo-noise calibration signal ECN.

Figure 4:
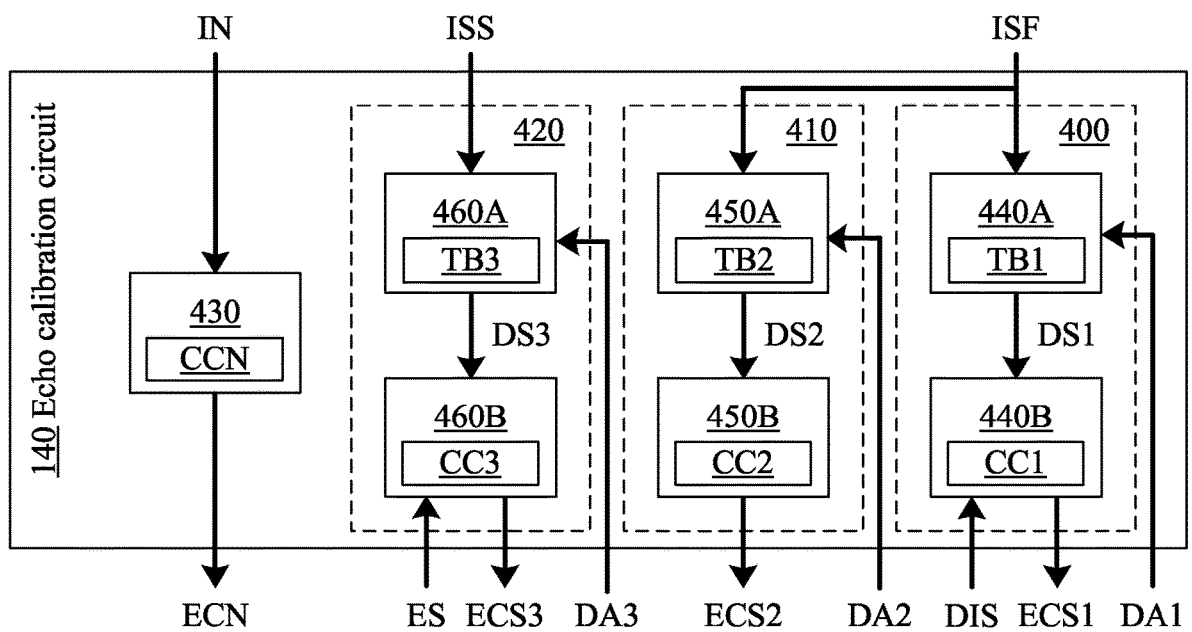
FIG. 4 illustrates a detailed block diagram of the echo calibration circuit according to an embodiment of the present invention.

FIG. 4 illustrates a detailed block diagram of the echo calibration circuit 140 according to an embodiment of the present invention. The echo calibration circuit 140 includes an output calibration circuit 400, an output echo-canceling calibration circuit 410, a mismatch echo-canceling calibration circuit 420 and a pseudo-noise calibration circuit 430.

The output calibration circuit 400 includes a first mapping circuit 440A and a first response circuit 440B. The first mapping circuit 440A receives and performs mapping on the first processed digital signal ISF according to a first codeword offset table TB1 of the codeword offset tables to generate a first mapping signal DS1. The first response circuit 440B receives and processes the first mapping signal DS1 according to a first group CC1 of the plurality of groups of response coefficients to generate an output calibration signal ECS1.

The output echo-canceling calibration circuit 410 includes a second mapping circuit 450A and a second response circuit 450B. The second mapping circuit 450A receives and performs mapping on the first processed digital signal ISF according to a second codeword offset table TB2 to generate a second mapping signal DS2. The second response circuit 450B receives and processes the second mapping signal DS2 according to a second group CC2 of the plurality of groups of response coefficients to generate an output echo-canceling calibration signal ECS2.

The mismatch echo-canceling calibration circuit 420 includes a third mapping circuit 460A and a third response circuit 460B. The third mapping circuit 460A receives and performs mapping on the second processed digital signal ISS according to a third codeword offset tables TB3 to generate a third mapping signal DS3. The third response circuit 460B receives and processes the third mapping signal DS3 according to a third group CC3 of the plurality of groups of response coefficients to generate a mismatch echo-canceling calibration signal ECS3.

In the mapping circuits described above, each of the codeword offset tables includes a plurality of one-to-one corresponding relations between a plurality of codewords and a plurality of codeword offset values. The input codeword corresponds to one of the codewords in the first codeword offset table TB1 and the second codeword offset table TB2. For the third codeword offset tables TB3, less corresponding relations between the codewords and the codeword offset values are included since the second processed digital signal ISS received by the third mapping circuit 460A has a fewer bits. In an initial status, all the codeword offset values are set to be 0.

The pseudo-noise calibration circuit 430 receives and processes the pseudo-noise digital signal IN according to the group of pseudo-noise response coefficients CCN to generate the pseudo-noise calibration signal ECN.

In an embodiment, the digital-to-analog conversion apparatus 100 in FIG. 1 further includes an error calculation circuit 160 to calculate an error signal DIS, which is a difference between the echo signal ES and a sum of the calibration signals described above (i.e., ECN1-ECN3 and ECN).

The calibration parameter calculating circuit 150 generates a plurality of offset values according to the error signal DIS and path information related to the echo calibration circuit 140. In an embodiment, such path information includes path delays DL1-DL3 each corresponding to a delay amount of a path from one of the response circuits to the calibration parameter calculating circuit 150. Since the processing of these circuits requires time, the calibration parameter calculating circuit 150 needs to track the calculated offset values such that these offset values correspond to the correct input codewords according to the path delays DL1-DL3.

In an embodiment, the calibration parameter calculating circuit 150 receives the first, the second and the third response coefficients CC1-CC3 of the first, the second and the third response circuit 440B-460B, performs one-dimensional inversion respectively on these response coefficients, multiplies the values of the error signal DIS by the inversed response coefficients and accumulates the multiplication results to generate corresponding inverted offsets values. According to the path delays DL1-DL3, the calibration parameter calculating circuit 150 further sets each of the inverted offset values to be the first, the second and the third offset values DA1-DA3 corresponding to the first, the second and the third mapping circuits 440A-460A.

It is appreciated that the generation of the offset values described above is merely an example. In other embodiments, the calibration parameter calculating circuit 150 may generate the offset values by using other methods.

The echo calibration circuit 140 further performs training according to the error signal DIS and the pseudo-noise transmission path information from the digital-to-analog conversion circuit 120 to the echo transmission circuit 130 such that each of the groups of response coefficients converges to accomplish the object of performing calibration on the digital-to-analog conversion circuit 120. The pseudo-noise transmission path information can be obtained according to the feeding of the pseudo-noise digital signal IN and the transmission of the pseudo-noise analog signal ON.

In order to avoid the interaction between the training objects, the digital-to-analog conversion apparatus 100 performs training having different stages.

In a first training stage, only the output conversion circuit 300 is enabled to generate the output analog signal OD and the other conversion circuits are disabled such that the first response circuit 440B makes the first response coefficients CC1 converge according to the error signal DIS.

In a second training stage, the pseudo-noise conversion circuit 330 is further enabled to generate the pseudo-noise analog signal ON such that the pseudo-noise calibration circuit 430 makes the group of pseudo-noise response coefficients CCN converge according to the echo signal ES, the response and rounding circuit 220 updates conversion path response parameter FX according to the converged pseudo-noise response coefficients CCN and the second and the third response circuits 450B-450C set the group of converged pseudo-noise response coefficients CCN to be the second and the third response coefficients CC2-CC3.

In a third training stage, the output echo-canceling conversion circuit 310 and the mismatch echo-canceling conversion circuit 320 are further enabled to generate the output echo-canceling analog signal OEC and the mismatched echo-canceling analog signal MEC and update the first, the second and the third codeword offset tables TB1-TB3 according to the first, the second and the third offset values DA1-DA3 respectively related to one of the calibration circuits.

In an embodiment, the offset values of the current sources included in the output conversion circuit 300 and the output echo-canceling conversion circuit 310 have different combinations generated according to different combinations of the input codewords such that a mapping relation exists between the offset values of the current sources and the offset values of the input codewords.

The number of the current sources is far less than the combinations of the input codewords. As a result, in the third training stage and corresponding to each of the output conversion circuit 300 and the output echo-canceling conversion circuit 310, the calibration parameter calculating circuit 150 distinguishes the offset values that the different input codeword corresponds to (e.g., the first and the second offset values DA1-DA2) into a plurality of value groups according to an operation status of each of the current sources. The calibration parameter calculating circuit 150 further sets each of the current sources to be a target current source to further set a corresponding current offset value calculation formula. The current offset value calculation formula is a subtraction result of two of the value groups such that the current offset value of each of the current sources besides the target current source cancels out in the two value groups The calibration parameter calculating circuit 150 substitutes the offset values to the current offset value calculation formula that each of the current sources corresponds to, so as to calculate the current offset value of the target current source. The calibration parameter calculating circuit 150 further converts the current offset value of the current sources to a plurality of codeword offset values to update the corresponding first codeword offset table TB1 and the second codeword offset table TB2.

The condition that the current sources includes 15 thermometer-controlled current sources CA-CO and 4 binary-controlled current sources CP-CS is used as an example in the following paragraphs to describe the operation of the calibration parameter calculating circuit 150. However, the number of the current sources of the present invention is not limited thereto.

Figure 5:
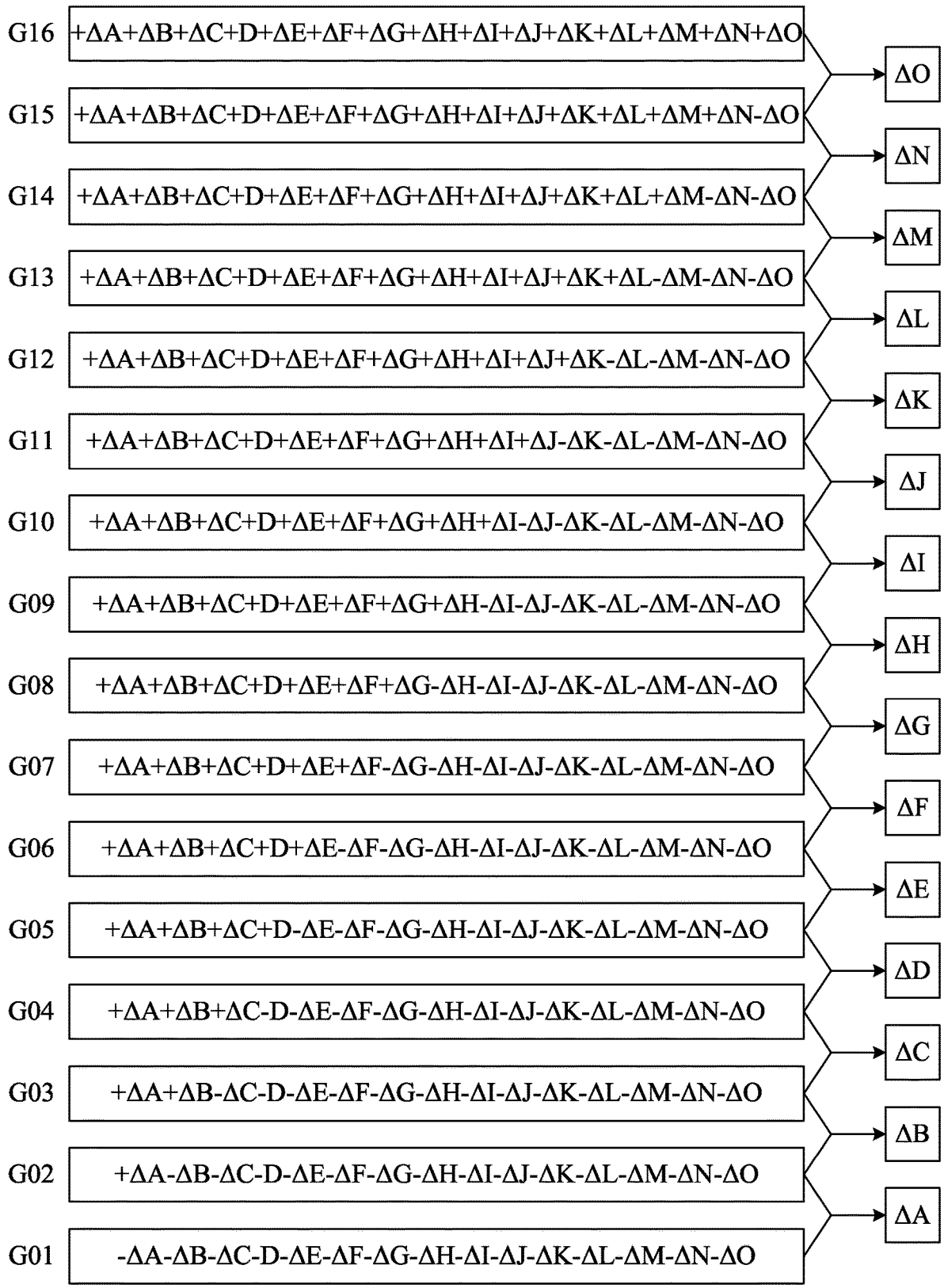
FIG. 5 illustrates a diagram of the value groups of the offset values distinguished according to the operation status of each of the current sources according to an embodiment of the present invention.

Reference is now made to FIG. 5. FIG. 5 illustrates a diagram of the value groups G01-G16 of the offset values distinguished according to the operation status of each of the current sources CA-CO according to an embodiment of the present invention. The current offset values of the current sources CA-CO are $\Delta A$-$\Delta O$. The current offset values are represented as $+\Delta A$-$+\Delta O$ when the current sources CA-CO are operated under a first current output status and are represented as $-\Delta A$—$-\Delta O$ when the current sources CA-CO are operated under a second current output status.

The value group G01 corresponds to the thermometer code that controls all the current sources CA-CO to operate under the second current output status, which is (0000). The binary code can be any combinations of (0000-1111). As a result, 16 input codewords, which are (00000000-00001111), are distinguished to the value group G01. When more and more generated offset values that belong to the value group G01 are averaged, the current offset values of the current sources CP-CS cancel out such that the average approximates a sum of the current offset values of the current sources CA-CO, which is $-\Delta A$-$\Delta B$-$\Delta C$- . . . $-\Delta O$. Based on the same rationale, each of the input codewords can be distinguished to one of the value groups and each of the value groups corresponds to a sum of the current offset values.

One of the current offset values of the thermometer-controlled current sources can be generated according to the difference of the average values between each two neighboring value groups. For example, the difference of the average values between the value groups G02 and G01 can be expressed by the following equation:

$$(+\Delta A\text{-}\Delta B\text{-}\Delta C\text{- } \ldots \Delta O)-(-\Delta A\text{-}\Delta B\text{-}\Delta C\text{- } \ldots \text{-}\Delta O)=+2\Delta A$$

As a result, the current offset value $\Delta A$ of the current source CA can be generated according to the difference between the average values of the value groups G02 and G01. Similarly, the current offset values $\Delta B$-$\Delta O$ of the current sources CB-CO can be generated respectively according to the differences between the average values of the value groups G03 and G02, the value groups G04 and G03, . . . and the value groups G16 and G15.

According to the relations of the value groups described above, the calibration parameter calculating circuit 150 sets the differences of the average values between the value groups as the current offset value calculation formulas. The calibration parameter calculating circuit 150 further substitutes the offset values to each of the current offset value calculation formulas to perform calculation. As a result, the current offset values can be obtained according to the feeding of the offset values without the need to perform statistics on the value groups G01-G16.

Reference is now made to FIG. 6. FIG. 6 illustrates a detailed diagram of the value groups G01 and G16 according to an embodiment of the present invention.

The offset values distinguished into each of the value groups also include 16 combinations of the current offset values of the binary-controlled current sources CP-CS. Take the value groups G01 and G16 as an example, the current offset values of the current sources CP-CS are $\Delta P$-$+\Delta S$. The current offset values are represented as +ΔP-+ΔS when the current sources CP-CS are operated under the first current output status and are represented as ΔP—ΔS when the current sources CP-CS are operated under the second current output status. Based on the operation status, the current offset values of each of the value groups have 16 combinations as illustrated in FIG. 6. The 16 combinations corresponding to the value group G01 are labeled as P01-P16. The 16 combinations corresponding to the value group G16 are labeled as N01-N16.

In the value groups G01-G16, a first group and a second group of the current offset values can be selected, in which the thermometer codes corresponding to the first group and the second group make the operation status of each of the thermometer-controlled current sources completely opposite. In the first group and the second group, the offset values that make each of the binary-controlled current sources operated under the first current output status can be distinguished into a group to perform averaging to generate the current offset value of one of the binary-controlled current sources.

Take the value groups G01 and G16 as an example, the thermometer code (0000) that the value group G01 corresponds to make the current sources CA-CO all operated under the second current output status. The thermometer code (1111) that the value group G16 corresponds to make the current sources CA-CO all operated under the first current output status opposite to the second current output status.

Take the current source CP as an example, in the value groups G01 and G16, the offset values that make the current source CP operated under the first current output status are distinguished into a group to perform averaging. As illustrated in FIG. 6, the offset values that make the current source CP operated under the first current output status correspond to the combinations N09-N16 and P09-P16 identified by white round points. After the averaging is performed, the current offset values ΔQ-ΔS in these combinations cancel out such that only the current offset value ΔP of the current source CP remains. The current offset values ΔQ-ΔS can be generated by using the same method. More specifically, the current offset values ΔQ-ΔS can be generated by performing averaging on the groups identified by black round points, white square points and black square points respectively.

According to the relations of the value groups described above, the calibration parameter calculating circuit 150 sets the differences of the average values between the value groups as the current offset value calculation formulas. The calibration parameter calculating circuit 150 further substitutes the offset values to each of the current offset value calculation formulas to perform calculation to obtain the corresponding current offset values.

In an embodiment, the calibration parameter calculating circuit 150 sets the current offset values of two of current sources to be 0 as anchor points to avoid the interaction of the system.

By using the method described above, the calibration parameter calculating circuit 150 can update the first and the second codeword offset tables TB1-TB2 of the first and the second mapping circuits 440A-450A. Since the third codeword offset tables TB3 of the third mapping circuit 460A has fewer codewords and corresponding relations with the codeword offset values, the third codeword offset tables TB3 can be selectively updated according to the feeding of the third offset values DA directly without setting any anchor points. However, the present invention is not limited thereto.

In an embodiment, each of the output conversion circuit 300 and the output echo-canceling conversion circuit 310 further includes a control circuit (not illustrated) to sort the current offset values that the current sources correspond to, so as to generate a turn-on order to turn on the current sources according to the input codeword based on the turn-on order by using a thermometer control mechanism such that a linearity of the current sources when the current sources turn on according to the turn-on order is larger than a predetermined value. The setting of the turn-on order can be performed by using different methods and is not described herein.

In an embodiment, the digital-to-analog conversion apparatus 100 in FIG. 1 further includes a remained echo-canceling circuit 170 (abbreviated as REC in FIG. 1) to further cancel the remained echo.

Figure 7:
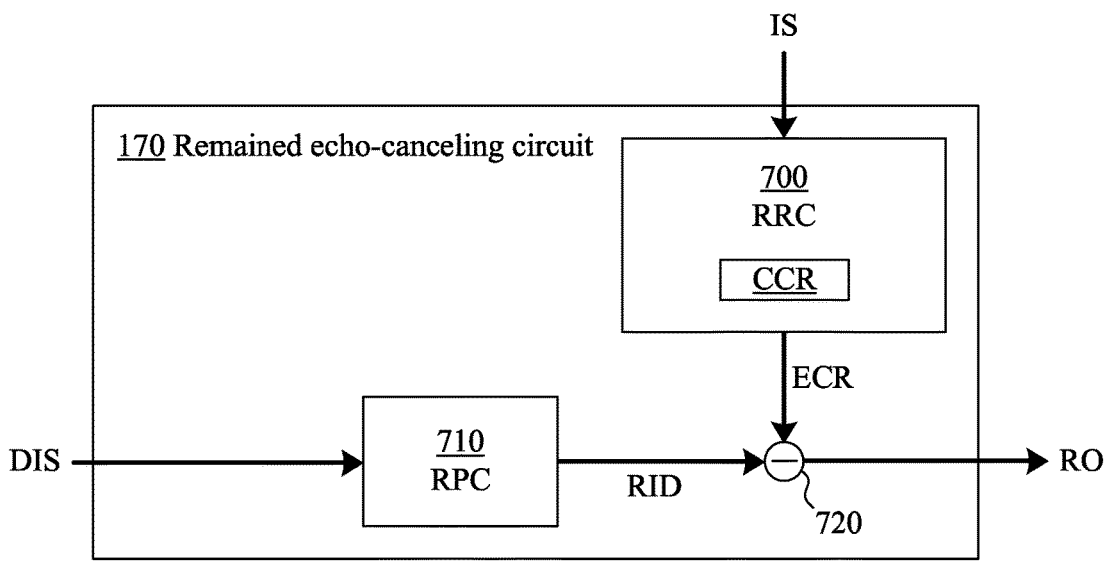
FIG. 7 illustrates a more detailed diagram of the remained echo-canceling circuit according to an embodiment of the present invention.

Reference is now made to FIG. 7. FIG. 7 illustrates a more detailed diagram of the remained echo-canceling circuit 170 according to an embodiment of the present invention. The remained echo-canceling circuit 170 includes a remained response circuit 700 (abbreviated as RRC in FIG. 7), a remained processing circuit 710 (abbreviated as RPC in FIG. 7) and a canceling circuit 720.

The remained response circuit 700 receives and processes the input digital signal IS according to a group of remained echo response coefficients CCR to generate a remained echo-canceling signal ECR. The remained processing circuit 710 receives and processes the error signal DIS to perform such as, but not limited to down-sampling to generate a remained echo signal RID operated under the second frequency. The canceling circuit 720 subtracts the remained echo-canceling signal ECR from the remained echo signal RID to generate a remained echo output signal RO. The remained response circuit 700 makes the remained echo response coefficients CCR converge according to the remained echo output signal RO.

As a result, the digital-to-analog conversion apparatus 100 of the present invention disposes conversion circuits for echo-canceling and corresponding echo calibration circuits based on different sources and types of echoes, such that the conversion circuits generate echo-canceling signals to cancel the echoes and the echo calibration circuits decrease the static mismatch offsets of the conversion circuits to obtain a better echo-canceling result.

Figure 8:
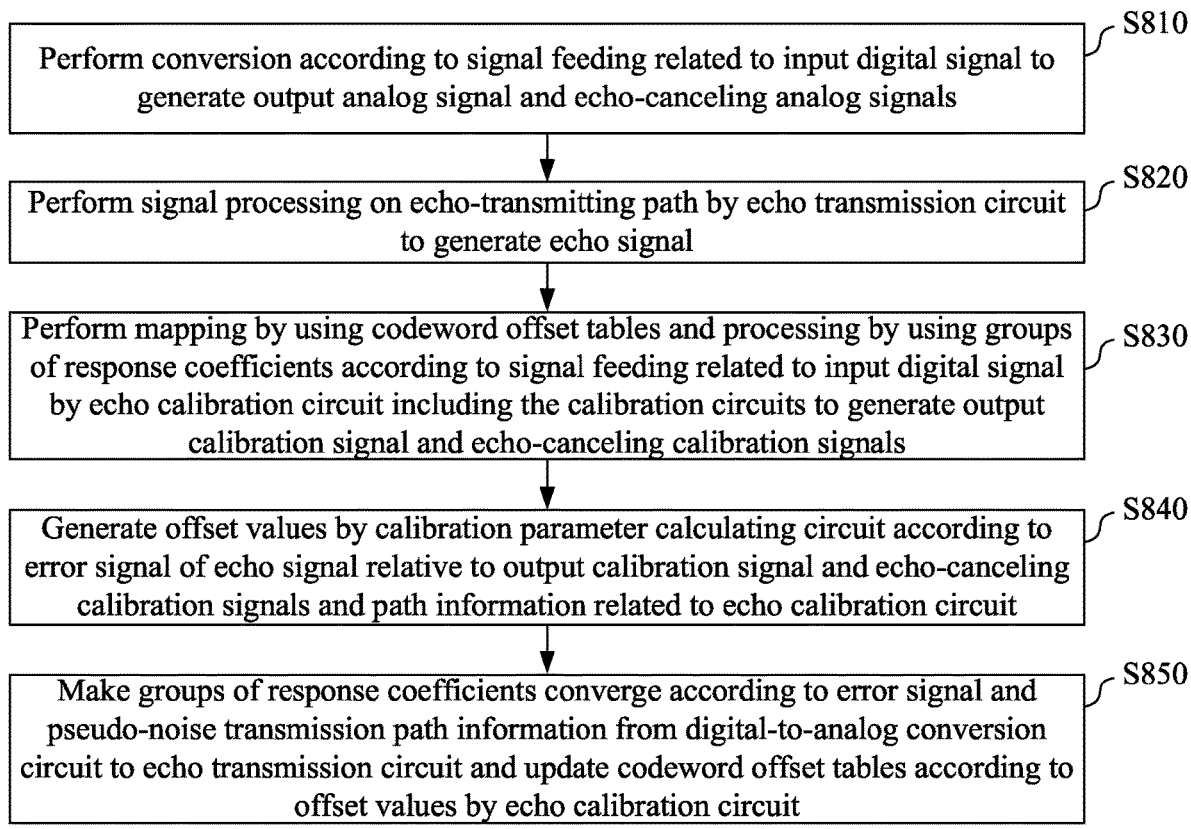
FIG. 8 illustrates a flow chart of a digital-to-analog conversion method having signal calibration mechanism according to an embodiment of the present invention.

Reference is now made to FIG. 8. FIG. 8 illustrates a flow chart of a digital-to-analog conversion method 800 having signal calibration mechanism according to an embodiment of the present invention.

In addition to the apparatus described above, the present disclosure further provides the digital-to-analog conversion method 800 having signal calibration mechanism that can be used in such as, but not limited to, the digital-to-analog conversion apparatus 100 in FIG. 1. As illustrated in FIG. 8, an embodiment of the digital-to-analog conversion method 800 includes the following steps.

In step S810, conversion is performed according to the signal feeding related to the input digital signal IS having the input codeword by the digital-to-analog conversion circuit 120 including the conversion circuits, to generate the output analog signal OD and the echo-canceling analog signals, wherein the echo-canceling analog signals perform output echo-canceling and mismatch echo-canceling on the output analog signal OD on the echo-transmitting path EP.

In step S820, signal processing is performed on the echo-transmitting path EP by the echo transmission circuit 130 to generate the echo signal ES.

In step S830, mapping is performed by using the codeword offset tables and processing is performed by using the groups of response coefficients according to the signal feeding related to the input digital signal IS by the echo calibration circuit 140 including the calibration circuits corresponding to the conversion circuits, to generate the output calibration signal ECS1 and the echo-canceling calibration signals.

In step S840, the offset values are generated by the calibration parameter calculating circuit 150 according to the error signal DIS of the echo signal ES relative to the output calibration signal ECS1 and the echo-canceling calibration signals and path information related to the echo calibration circuit 140.

In step S850, the groups of response coefficients are made to converge according to the error signal ES and pseudo-noise transmission path information from the digital-to-analog conversion circuit 120 to the echo transmission circuit 130 and the codeword offset tables are updated according to the offset values by the echo calibration circuit 140.

It is appreciated that the embodiments described above are merely an example. In other embodiments, it should be appreciated that many modifications and changes may be made by those of ordinary skill in the art without departing, from the spirit of the disclosure.

In summary, the present invention discloses the digital-to-analog conversion apparatus and the digital-to-analog conversion method having signal calibration mechanism that dispose conversion circuits for echo-canceling and corresponding echo calibration circuits based on different sources and types of echoes, such that the conversion circuits generate echo-canceling signals to cancel the echoes and the echo calibration circuits decrease the static mismatch offsets of the conversion circuits to obtain a better echo-canceling result.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion apparatus having signal calibration mechanism, comprising:
    a digital-to-analog conversion circuit comprising a plurality of conversion circuits to perform conversion according to a signal feeding related to an input digital signal having an input codeword to generate an output analog signal and a plurality of echo-canceling analog signals, wherein the echo-canceling analog signals perform output echo-canceling and mismatch echo-canceling on the output analog signal on an echo-transmitting path;
    an echo transmission circuit to perform signal processing on the echo-transmitting path to generate an echo signal;
    an echo calibration circuit comprising a plurality of calibration circuits corresponding to the conversion circuits to perform mapping by using a plurality of codeword offset tables and perform processing by using a plurality of groups of response coefficients according to the signal feeding related to the input digital signal, to generate an output calibration signal and a plurality of echo-canceling calibration signals; and
    a calibration parameter calculating circuit to generate a plurality of offset values according to an error signal, which is a difference between the echo signal and a sum of the output calibration signal and the echo-canceling calibration signals, and path information related to the echo calibration circuit;
    wherein the echo calibration circuit makes the groups of response coefficients converge according to the error signal and pseudo-noise transmission path information from the digital-to-analog conversion circuit to the echo transmission circuit and updates the codeword offset tables according to the offset values.

2. The digital-to-analog conversion apparatus of claim 1, further comprising a signal input circuit to perform signal feeding on the digital-to-analog conversion circuit and comprising:
    an up-sampling circuit to perform up-sampling on the input digital signal to generate an up-sampled signal;
    a filtering and rounding circuit to perform filtering and rounding on the up-sampled signal to generate and feed a first processed digital signal to the digital-to-analog conversion circuit;
    a response and rounding circuit to perform processing on the up-sampled signal according to a conversion path response parameter and perform rounding on the up-sampled signal to generate and feed a second processed digital signal to the digital-to-analog conversion circuit; and
    a pseudo-noise generation circuit to generate and feed a pseudo-noise digital signal to the digital-to-analog conversion circuit.

3. The digital-to-analog conversion apparatus of claim 2, wherein the digital-to-analog conversion circuit comprises:
    an output conversion circuit to receive and perform conversion on the first processed digital signal to generate the output analog signal;
    an output echo-canceling conversion circuit to receive and perform conversion on the first processed digital signal to generate an output echo-canceling analog signal of the echo-canceling analog signals to the echo-transmitting path;
    a mismatch echo-canceling conversion circuit to receive and perform conversion on the second processed digital signal to generate a mismatched echo-canceling analog signal of the echo-canceling analog signals to the echo-transmitting path; and
    a pseudo-noise conversion circuit to receive and perform conversion on the pseudo-noise digital signal to generate a pseudo-noise analog signal to the echo-transmitting path.

4. The digital-to-analog conversion apparatus of claim 3, wherein the echo calibration circuit comprises:
    an output calibration circuit comprising:
        a first mapping circuit to receive and perform mapping on the first processed digital signal according to a first codeword offset table of the codeword offset tables to generate a first mapping signal; and
        a first response circuit to receive and process the first mapping signal according to a first group of the plurality of groups of response coefficients to generate an output calibration signal;
    an output echo-canceling calibration circuit comprising:
        a second mapping circuit to receive and perform mapping on the first processed digital signal according to a second codeword offset table of the codeword offset tables to generate a second mapping signal; and a second response circuit to receive and process the second mapping signal according to a second group of the plurality of groups of response coefficients to generate an output echo-canceling calibration signal of the echo-canceling calibration signals;

a mismatch echo-canceling calibration circuit comprising:
a third mapping circuit to receive and perform mapping on the second processed digital signal according to a third codeword offset table of the codeword offset tables to generate a third mapping signal; and
a third response circuit to receive and process the third mapping signal according to a third group of the plurality of groups of response coefficients to generate a mismatch echo-canceling calibration signal of the echo-canceling calibration signals; and a pseudo-noise calibration circuit to receive and process the pseudo-noise digital signal according to a group of pseudo-noise response coefficients to generate a pseudo-noise calibration signal.

5. The digital-to-analog conversion apparatus of claim 4, wherein in a first training stage, only the output conversion circuit is enabled such that the first response circuit makes the first group of response coefficients converge according to the error signal;

in a second training stage, the pseudo-noise conversion circuit is further enabled such that the pseudo-noise calibration circuit makes the group of pseudo-noise response coefficients converge according to the echo signal, the response and rounding circuit updates the conversion path response parameter according to the group of converged pseudo-noise response coefficients, and the second response circuit and the third response circuit set the group of converged pseudo-noise response coefficients to be the second group of response coefficients and third group of response coefficients respectively; and in a third training stage, the output echo-canceling conversion circuit and the mismatch echo-canceling conversion circuit are further enabled to update the first codeword offset table, the second codeword offset table and the third codeword offset table according to a first offset value, a second offset value and a third offset value of the offset values respectively related to the output calibration circuit, the output echo-canceling calibration circuit and the mismatch echo-canceling calibration circuit.

6. The digital-to-analog conversion apparatus of claim 5, wherein each of the output conversion circuit, the output echo-canceling conversion circuit and the mismatch echo-canceling conversion circuit comprises a plurality of current sources each having a current offset value;

in the third training stage and corresponding to each of the output conversion circuit and the output echo-canceling conversion circuit, the calibration parameter calculating circuit is configured to:
distinguish the offset values that the different input codeword corresponds to into a plurality of value groups according to an operation status of each of the current sources;
set each of the current sources to be a target current source to further set a corresponding current offset value calculation formula wherein the current offset value calculation formula is a subtraction result of two of the value groups such that the current offset value of each of the current sources besides the target current source cancels out in the two value groups;
substitute the offset values to the current offset value calculation formula that each of the current sources corresponds to, so as to calculate the current offset value of the target current source; and
convert the current offset value of the current sources to a plurality of codeword offset values to update the corresponding first codeword offset table and the second codeword offset table.

7. The digital-to-analog conversion apparatus of claim 6, wherein each of the output calibration circuit and the output echo-canceling calibration circuit sets the current offset values of two of current sources to be 0 as anchor points.

8. The digital-to-analog conversion apparatus of claim 6, wherein each of the output conversion circuit and the output echo-canceling conversion circuit further comprises a control circuit to sort the current offset values that the current sources correspond to, so as to generate a turn-on order to turn on the current sources according to the input codeword based on the turn-on order by using a thermometer control mechanism such that a linearity of the current sources when the current sources turn on according to the turn-on order is larger than a predetermined value.

9. The digital-to-analog conversion apparatus of claim 1, further comprising a remained echo-canceling circuit that comprises:
a remained response circuit to receive and process the input digital signal according to a group of remained echo response coefficients to generate a remained echo-canceling signal;
a remained processing circuit to receive and process the error signal to generate a remained echo signal; and
a canceling circuit to subtract the remained echo-canceling signal from the remained echo signal to generate a remained echo output signal;
wherein the remained response circuit makes the remained echo response coefficients converge according to the remained echo output signal.

10. A digital-to-analog conversion method having signal calibration mechanism used in a digital-to-analog conversion apparatus, comprising:
performing conversion according to a signal feeding related to an input digital signal having an input codeword by a digital-to-analog conversion circuit comprising a plurality of conversion circuits, to generate an output analog signal and a plurality of echo-canceling analog signals, wherein the echo-canceling analog signals perform output echo-canceling and mismatch echo-canceling on the output analog signal on an echo-transmitting path;
performing signal processing on the echo-transmitting path by an echo transmission circuit to generate an echo signal;
performing mapping by using a plurality of codeword offset tables and performing processing by using a plurality of groups of response coefficients according to the signal feeding related to the input digital signal by an echo calibration circuit comprising a plurality of calibration circuits corresponding to the conversion circuits, to generate an output calibration signal and a plurality of echo-canceling calibration signals;
generating a plurality of offset values by a calibration parameter calculating circuit according to an error signal, which is a difference between the echo signal and a sum of the output calibration signal and the echo-canceling calibration signals, and path information related to the echo calibration circuit; and making the groups of response coefficients converge according to the error signal and pseudo-noise transmission path information from the digital-to-analog conversion circuit to the echo transmission circuit and updating the codeword offset tables according to the offset values by the echo calibration circuit.

11. The digital-to-analog conversion method of claim 10, wherein the digital-to-analog conversion apparatus further comprises a signal input circuit to perform signal feeding on the digital-to-analog conversion circuit, the digital-to-analog conversion method comprising:

performing up-sampling on the input digital signal by an up-sampling circuit of the signal input circuit to generate an up-sampled signal;

performing filtering and rounding on the up-sampled signal by a filtering and rounding circuit of the signal input circuit to generate and feed a first processed digital signal to the digital-to-analog conversion circuit;

performing processing on the up-sampled signal according to a conversion path response parameter and performing rounding on the up-sampled signal by a response and rounding circuit of the signal input circuit to generate and feed a second processed digital signal to the digital-to-analog conversion circuit; and generating and feeding a pseudo-noise digital signal to the digital-to-analog conversion circuit by a pseudo-noise generation circuit.

12. The digital-to-analog conversion method of claim 11, further comprising:

receiving and performing conversion on the first processed digital signal by an output conversion circuit of the digital-to-analog conversion circuit to generate the output analog signal;

receiving and performing conversion on the first processed digital signal by an output echo-canceling conversion circuit of the digital-to-analog conversion circuit to generate an output echo-canceling analog signal of the echo-canceling analog signals to the echo-transmitting path;

receiving and performing conversion on the second processed digital signal by a mismatch echo-canceling conversion circuit of the digital-to-analog conversion circuit to generate a mismatched echo-canceling analog signal of the echo-canceling analog signals to the echo-transmitting path; and receiving and performing conversion on the pseudo-noise digital signal by a pseudo-noise conversion circuit of the digital-to-analog conversion circuit to generate a pseudo-noise analog signal to the echo-transmitting path.

13. The digital-to-analog conversion method of claim 12, further comprising:

receiving and performing mapping on the first processed digital signal according to a first codeword offset table of the codeword offset tables by a first mapping circuit of a output calibration circuit of the echo calibration circuit to generate a first mapping signal;

receiving and processing the first mapping signal according to a first group of the plurality of groups of response coefficients by a first response circuit of the output calibration circuit of the echo calibration circuit to generate an output calibration signal;

receiving and performing mapping on the first processed digital signal according to a second codeword offset table of the codeword offset tables by a second mapping circuit of an output echo-canceling calibration circuit of the echo calibration circuit to generate a second mapping signal;

receiving and processing the second mapping signal according to a second group of the plurality of groups of response coefficients by a second response circuit of the output echo-canceling calibration circuit of the echo calibration circuit to generate an output echo-canceling calibration signal of the echo-canceling calibration signals;

receiving and performing mapping on the second processed digital signal according to a third codeword offset table of the codeword offset tables by a third mapping circuit of a mismatch echo-canceling calibration circuit of the echo calibration circuit to generate a third mapping signal;

receiving and processing the third mapping signal according to a third group of the plurality of groups of response coefficients by a third response circuit of the mismatch echo-canceling calibration circuit of the echo calibration circuit to generate a mismatch echo-canceling calibration signal of the echo-canceling calibration signals; and receiving and processing the pseudo-noise digital signal according to a group of pseudo-noise response coefficients by a pseudo-noise calibration circuit of the echo calibration circuit to generate a pseudo-noise calibration signal.

14. The digital-to-analog conversion method of claim 13, further comprising:

in a first training stage, enabling only the output conversion circuit such that the first response circuit makes the first group of response coefficients according to the error signal;

in a second training stage, further enabling the pseudo-noise conversion circuit such that the pseudo-noise calibration circuit makes the group of pseudo-noise response coefficients converge according to the echo signal, the response and rounding circuit updates the conversion path response parameter according to the group of converged pseudo-noise response coefficients, and the second response circuit and the third response circuit set the group of converged pseudo-noise response coefficients to be the second group of response coefficients and third group of response coefficients respectively; and in a third training stage, further enabling the output echo-canceling conversion circuit and the mismatch echo-canceling conversion circuit to update the first codeword offset table, the second codeword offset table and the third codeword offset table according to a first offset value, a second offset value and a third offset value of the offset values respectively related to the output calibration circuit, the output echo-canceling calibration circuit and the mismatch echo-canceling calibration circuit.

15. The digital-to-analog conversion method of claim 14, wherein each of the output conversion circuit, the output echo-canceling conversion circuit and the mismatch echo-canceling conversion circuit comprises a plurality of current sources each having a current offset value, the digital-to-analog conversion method, in the third training stage and corresponding to each of the output conversion circuit and the output echo-canceling conversion circuit, further comprises:

distinguishing the offset values that the different input codeword corresponds to into a plurality of value groups according to an operation status of each of the current sources by the calibration parameter calculating circuit;

setting each of the current sources to be a target current source by the calibration parameter calculating circuit to further set a corresponding current offset value calculation formula wherein the current offset value calculation formula is a subtraction result of two of the value groups such that the current offset value of each of the current sources besides the target current source cancels out in the two value groups;

substituting the offset values to the current offset value calculation formula that each of the current sources corresponds to, so as to calculate the current offset value of the target current source by the calibration parameter calculating circuit; and converting the current offset value of the current sources to a plurality of codeword offset values by the calibration parameter calculating circuit to update the corresponding first codeword offset table and the second codeword offset table.

16. The digital-to-analog conversion method of claim 15, further comprising:

setting the current offset values of two of current sources to be 0 as anchor points by each of the output calibration circuit and the output echo-canceling calibration circuit.

17. The digital-to-analog conversion method of claim 15, further comprising:

sorting the current offset values that the current sources correspond to by a control circuit comprised by each of the output conversion circuit and the output echo-canceling conversion circuit, so as to generate a turn-on order to turn on the current sources according to the input codeword based on the turn-on order by using a thermometer control mechanism such that a linearity of the current sources when the current sources turn on according to the turn-on order is larger than a predetermined value.

18. The digital-to-analog conversion method of claim 10, further comprising a remained echo-canceling circuit comprising:

receiving and processing the input digital signal according to a group of remained echo response coefficients by a remained response circuit of a remained echo-canceling circuit to generate a remained echo-canceling signal;

receiving and processing the error signal by a remained processing circuit of the remained echo-canceling circuit to generate a remained echo signal;

subtracting the remained echo-canceling signal from the remained echo signal by a canceling circuit of the remained echo-canceling circuit to generate a remained echo output signal; and making the remained echo response coefficients converge according to the remained echo output signal by the remained response circuit.

* * * * *